United States Patent [19]

Mortimer

[11] Patent Number: 5,003,551
[45] Date of Patent: Mar. 26, 1991

[54] INDUCTION MELTING OF METALS WITHOUT A CRUCIBLE

[75] Inventor: John H. Mortimer, Medford, N.J.

[73] Assignee: Inductotherm Corp., Rancocas, N.J.

[21] Appl. No.: 526,865

[22] Filed: May 22, 1990

[51] Int. Cl.[5] .............................................. H05B 6/30
[52] U.S. Cl. .................................. 373/139; 373/70;
373/138; 373/140; 219/7.5; 219/10.75;
219/10.79; 219/10.43
[58] Field of Search ................ 373/70, 138, 139, 140;
219/6.5, 7.5, 10.41, 10.43, 10.49, 10.67, 10.57,
10.71, 10.75, 10.77, 10.79

[56] References Cited

U.S. PATENT DOCUMENTS

| | | | |
|---|---|---|---|
| 2,686,864 | 8/1954 | Wroughton et al. | 219/1 |
| 3,310,384 | 3/1967 | Keller | 373/139 |
| 3,705,789 | 12/1972 | Keller | 373/139 |
| 4,578,552 | 3/1986 | Mortimer | 219/10.41 |
| 4,786,772 | 11/1988 | Umemoto et al. | 219/10.79 |

FOREIGN PATENT DOCUMENTS 647136 10/1964 Belgium ........................... 219/10.43

OTHER PUBLICATIONS

T. S. Piwonka et al., "Induction Melting and Casting of Titanium Alloy Aircraft Components", Report AF-FL-TR-72-168, 1972, Air Force Systems Command, Wright-Patterson AFB, Ohio.
G. J. S. Higginbotham, "From Research to Cost-Effective Directional Solidification and Single-Crystal Production-an Integrated Approach", *Materials Science and Technology*, vol. 2, May 1986.
J. Zotos et al., "Ductile High Strength Titanium Castings by Induction Melting", *American Foundrymen's Society Transactions*, vol. 66, 1958, pp. 225-230.

Primary Examiner—Bruce A. Reynolds
Assistant Examiner—Tu Hoang
Attorney, Agent, or Firm—Seidel, Gonda, Lavorgna & Monaco

[57] ABSTRACT

An apparatus and method for inductively melting a quantity of metal, without having to contain the metal in a crucible, is described. The solid metal to be melted is placed within a first induction coil excited by an alternating current and adapted to provide a greater electromagnetic force towards the lower portion of the quantity of metal. The solid metal rests on a support, having an opening therethrough, which also comprises means for keeping the support at a low temperature relative to the metal as it melts. When energy in the form of the alternating current is provided to the coil, the metal melts from the top downward, but the concentration of electro-magnetic force towards the bottom of the metal causes the liquid metal to retain a cylindrical shape. A non-varying electromagentic field is applied to the quantity of metal to minimize violent stirring of the molten portion of the quantity of metal caused by the time-varying field.

5 Claims, 2 Drawing Sheets

INDUCTION MELTING OF METALS WITHOUT A CRUCIBLE

Field of the Invention

This invention relates to the induction melting of a quantity of metal without the need for a crucible or other container. Instead, a magnetic field is used to contain the melt.

Background of the Invention

In the manufacture of metal castings it is important to avoid contamination of the metal with non-metallic inclusions. These inclusions are usually oxide phases, and are usually formed by reaction between the metals being melted and the crucible in which they are melted. It has long been an aim of metalcasters to avoid such contamination by using crucibles which have minimum reactivity with the melts. However, some alloys, in particular nickel-based superalloys, which may contain substantial amounts of aluminum, titanium, or hafnium, react vigorously with oxide crucibles and form inclusions during melting.

In the case of titanium-base alloys and alloys of refractory metals (tungsten, tantalum, molybdenum, niobium, hafnium, rhenium, and zirconium), crucible melting is virtually impossible because of the violence of reactions with the crucible. So a related aim of metalcasters is to find a way to melt these alloys without contamination.

Heretofore there have been two main methods of avoiding contamination from a crucible in metal smelting One method is "cold-crucible" melting, in which a water cooled copper crucible is used. The metal charge, which may be melted by induction, electric arc, plasma torch, or electron beam energy sources, freezes against the cold copper crucible wall. Thereafter, the liquid metal is held within a "skull" of solid metal of its own composition, instead of coming in contact with the crucible wall.

Another method is levitation melting. In levitation melting, a quantity of metal to be melted is electromagnetically suspended in space while it is heated. U.S. Pat. Nos. 2,686,864 to Wroughton et al. and 4,578,552 to Mortimer show methods of using induction coils to levitate a quantity of metal and heat it inductively.

Cold crucible melting and levitation melting necessarily consume a great deal of energy. In the case of cold-crucible melting, a substantial amount of energy is required merely to maintain the pool of molten metal within the skull, and much of the heating energy put into the metal must be removed deliberately just to maintain the solid outer portion With levitation melting, energy is required to keep the metal suspended. In addition, as compared to the surface of a molten bath in a conventional crucible, levitation melting causes the quantity of metal to have a large surface area, which is a source of heat loss by radiation. Additional energy is required to maintain the metal temperature.

For alloys which are mildly reactive with crucibles, such as the nickel-base superalloys referred to above, a process called the "Birlec" process has been used This process was developed by the Birmingham Electric Company in Great Britain. In the Birlec process, induction is used to melt just enough metal to pour one casting. Instead of pouring metal from the crucible conventionally, however, by tilting it and allowing the melt to flow over its lip, the crucible has an opening in its bottom covered with a "penny" or "button" of charge metal. After the charge is melted, heat transfer from the molten charge to the penny melts the penny, allowing the molten metal to fall through the opening into a waiting casting mold below.

By using a small quantity of metal with the proper induction melting frequency and power in the Birlec process, the metal can be "haystacked," or partially levitated, and held away from the crucible sides for much of the melting process, thus minimizing, although not eliminating, contact with the crucible sidewall. Such a process is in use today for the production of single crystal investment castings for the gas turbine industry. See, "From Research To Cost-Effective Directional Solidification And Single-Crystal Production—An Integrated Approach," by G. J. S. Higgenbotham, *Materials Science and Technology*, Vol. 2, May, 1986, pp. 442–460.

The use of "haystacking" to melt refractory and titanium alloys was tried by the U.S. Army at Watertown Arsenal in the 1950s, using carbon crucibles. See, J. Zotos, P.J. Ahearn and H. M. Green, "Ductile High Strength Titanium Castings By Induction Melting", *American Foundrymen's Society Transactions*, Vol. 66, 1958, pp. 225–230. An attempt was made to improve on their results in the 1970s by combining the haystacking process with the Birlec process. See, T.S. Piwonka and C.R. Cook, "Induction Melting and Casting of Titanium Alloy Aircraft Components" Report AFFL-TR-72-168, 1972, Air Force Systems Command, Wright-Patterson AFB, Ohio. Neither of these attempts was successful in eliminating carbon contamination from the crucible, and there was no satisfactory method of controlling the pouring temperature of the metal to the accuracy desired for aerospace work.

One effective solution to the problem of melting metals and controlling pouring temperature while avoiding contamination from the crucible is disclosed in co-pending application Ser. No. 07/339,271, entitled "Induction Melting of Metals Without a Crucible," and assigned to the same assignee as the present invention. The solution obtained by that invention is very effective for small (5–10 pounds or less) quantities of metal. For large (20 pounds or more) masses of metal, violent stirring of the charge could occur. The present invention solves the problem of melting metals and controlling pouring temperature in a non-contaminating environment, while avoiding violent stirring of the metal.

SUMMARY OF THE INVENTION

The invention is an apparatus and method for inductively melting a quantity of metal without a container. The quantity of metal, or "charge," is placed within an induction coil, which exerts on the metal an electromagnetic force which increases toward the bottom portion of the charge. The charge is free-standing on a support. The support has an opening therethrough, and further includes means for maintaining the support at a preselected temperature. Means are provided for applying to the quantity of metal a non-varying (i.e., direct-current) magnetic field.

In a preferred embodiment of the invention, the apparatus comprises an induction coil having a plurality of turns disposed around a charge of metal to be melted. The coil comprises extra turns toward its lower portion so that a greater electromagnetic force is directed to the lower portion of the metal. The topmost of these turns is wound in a direction opposite that of the other turns. The charge is not in a crucible, but is free-standing in its non-molten state on a support The support has an opening through it, through which liquid metal may pass as the charge melts. The means for applying the non-varying magnetic filed to the charge comprises a magneticallypermeable core excited by a direct current, the core being in operative association with the charge.

BRIEF DESCRIPTION OF THE DRAWINGS

For the purpose of illustrating the invention, there is shown in the drawings a form which is presently preferred; it being understood, however, that this invention is not limited to the precise arrangements and instrumentalities shown.

In FIG. 1, solid metal is represented by cross-hatching.

DETAILED DESCRIPTION OF THE INVENTION

Figure 1:
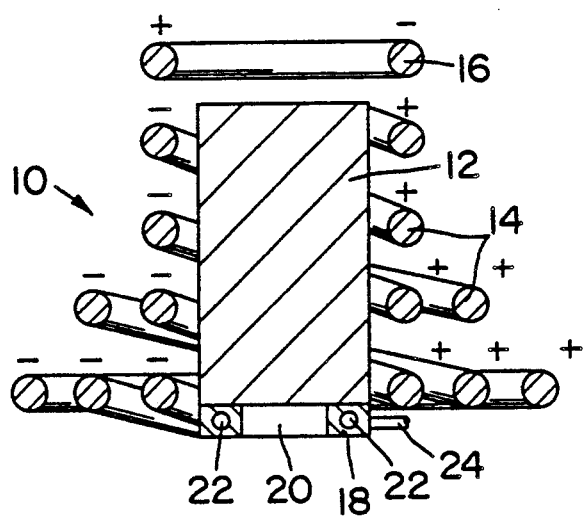
FIG. 1 is a schematic view of a charge of solid metal placed within a cylindrical induction coil according to the prior art.

Referring to the drawings, wherein like numerals indicate like elements in the several figures, there is shown in FIG. 1 a schematic view of an induction furnace for melting metals without a crucible, according to the prior art. A charge 12 of solid metal is located within an induction coil 10 having a plurality of turns 14. When energized by an alternating current in known manner, coil 10 generates a time-varying magnetic field which induces eddy currents within charge 12, thereby heating it. The general principles of induction heating and melting are well-known and need not be described here in detail.

Coil 10 may be referred to as a containment coil, and also generates an electromagnetic force on charge 12 when coil 10 is energized. Turns 14 are arranged so that the electromagnetic force they produce will be concentrated toward the lower portion of the charge 12. In the preferred embodiment, the lower coils are doubled, tripled, or otherwise multiplied toward the bottom of the coil. Alternatively, the turns 14 could be arranged so that the turns toward the bottom of the charge 12 are closer to the charge 12 than the upper turns. Another alternative is to provide a plurality of separate power supplies, each corresponding to a different portion of the charge 12 and coil 14, so that the lower turns have more electrical energy associated with them.

The charge 12, before it is melted, rests on a support 18, which includes an opening 20 therethrough. Support 18 is illustrated as an annular ring, but it need not be annular. However, it is preferable that opening 20 be circular. Support 18 includes means for maintaining a preselected temperature, relatively cold compared to the charge 12 as it is melted. A typical means for cooling support 18 comprises internal cavities 22 through which a liquid coolant, supplied by tube 24, circulates. A preferred material for support 18 is copper.

The topmost turn 16 of the induction coil 10 is wound in a direction opposite that of the other turns 14 of the induction coil. This reverse turn has the effect of preventing the charge 12 from partially levitating or haystacking. If the metal were to be partially levitated, the excess surface area created by the partial levitation would be a source of heat loss by radiation, which would decrease the melting efficiency of the coil. Levitation may also be prevented by the use of a suitably designed passive inductor such as a disc, ring, or similar structure located above charge 12 which suppresses the levitation forces.

The solid charge 12 is placed within the coil 10 in direct proximity to, but out of physical contact with, the turns 14. It should be emphasized that no crucible is used. The coil turns 14 are arranged so that the magnetic force that is generated supports the metal as it is melted and confines it to a cylindrical volume concentric with the center of the coil, while levitation of the melt is prevented by the arrangement described above.

Figure 2:
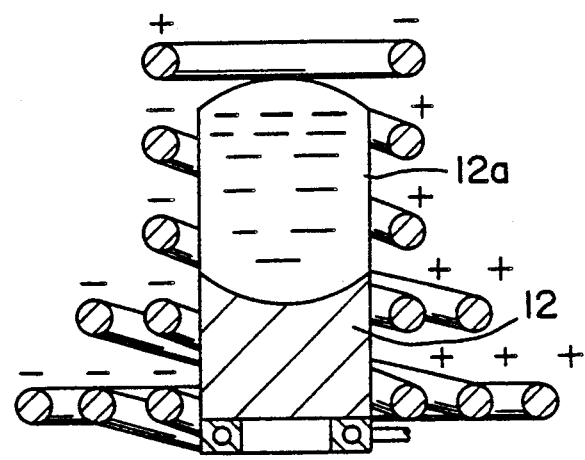
FIG. 2 shows a subsequent step of the melting of the charge in the induction coil of FIG. 1.

When power is applied to the coil 10, the metal begins to melt from the top of the charge (solid metal 12 is shown cross-hatched, and liquid metal 12a is shown stippled) as shown in FIG. 2. As melting proceeds, the liquid portion 12a increases and moves down the charge Because of the high magnetic forces provided by the extra turns at the base of the induction coil 10, the liquid portion 12a does not run over the sides of the charge 12 but remains confined to the original space occupied by the solid charge 12.

Finally the heat transfer from the liquid metal 12a to the remaining solid charge 12 melts all of the charge 12 except for a rim of metal which rests directly on the support 18. When the portion of the solid charge 12 adjacent to opening 20 finally melts through, the liquid metal will pass through opening 20 and will fall into the opening 30 of casting mold 32, or some other container. The charge 12 may be sized so as to have the same volume as casting mold 32. Because support 18 is kept at a relatively low temperature by the cooling means of tube 24 and internal cavities 22, the metal in close proximity to support 18, designated 26 in FIG. 4, will remain solid.

The apparatus described above and illustrated in FIGS. 1 and 2 works very well for small quantities of metal, on the order of 10 pounds or less. However, for larger quantities of metal, on the order of 20 pounds or more, there is the possibility of violent stirring of the molten metal towards the top of the charge. While some stirring is acceptable, and even desirable, violent stirring is not. Violent stirring could result in molten metal being ejected from the furnace. Limiting the risk of violent stirring by keeping the metal charge small is a drawback to use of the apparatus on a larger, commercial scale.

Figure 3:
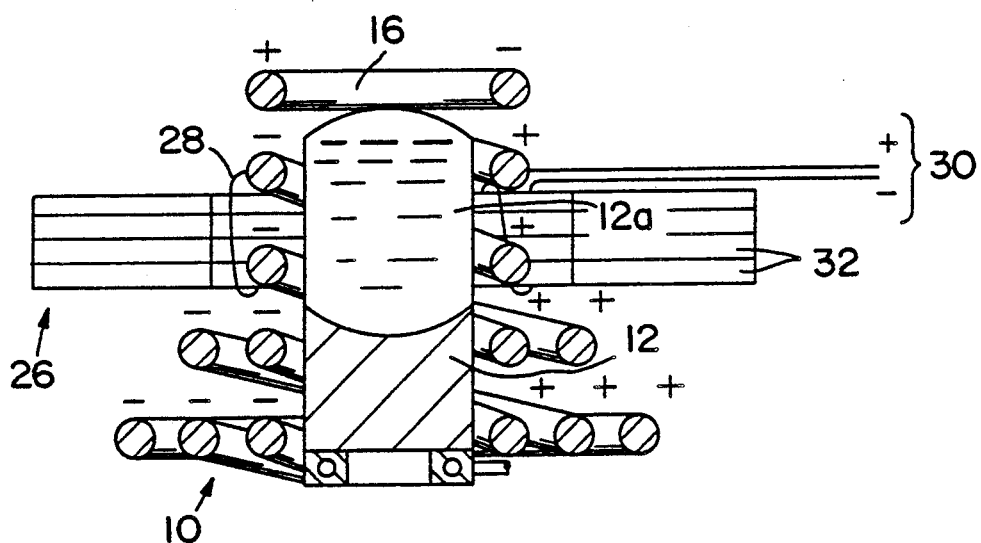
FIG. 3 is a schematic view of the present invention, showing the means for applying a non-varying magnetic field to the metal.
Figure 4:
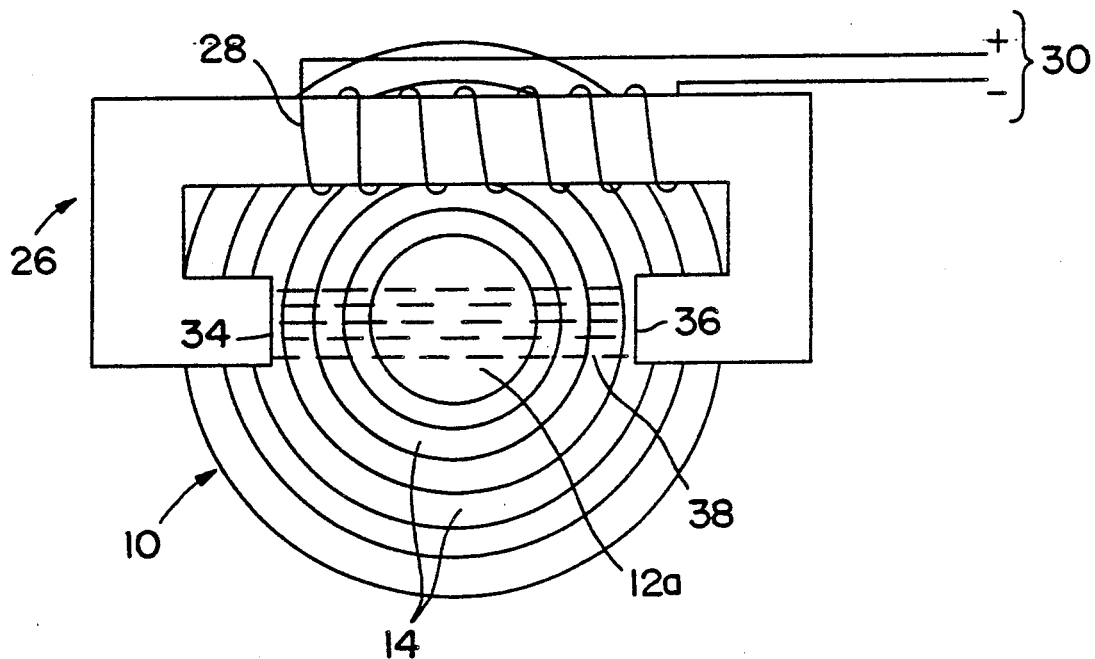
FIG. 4 is a top plan view of the apparatus shown in FIG. 3.

The present invention solves the problem of increasing the capacity of this type of furnace while preventing violent stirring In the present invention, violent stirring is suppressed by applying a non-varying magnetic field to the metal charge in addition to the time-varying magnetic field which induces eddy currents in the metal charge. The non-varying magnetic filed is generated by a core 26 and coil 28 which is excited by a direct current source 30, as shown in FIGS. 3 and 4. DC source 30 may be any suitable source of direct current. Coil 28 may be any suitable transformer-wound coil, and may be located anywhere on core 26. Core 26 is preferably constructed of a plurality of laminations 32, in known manner, to minimize eddy currents in the core.

Preferably, core 26 is C-shaped in plan and has two facing ends 34 and 36 which define a gap, across which extend DC flux lines 38, shown as dashed lines in FIG. 4. Thus, flux lines 38 represent a DC-derived non-varying magnetic field applied across the molten portion 12a of the metal charge 12. Movement of the molten metal caused by the time-varying field from containment coil 10 will cut across the flux lines of the non-varying field applied by core 26, inducing in the molten metal eddy currents that will cause a new magnetic field opposing the motion of the liquid metal, hence minimizing violent stirring Some stirring can still occur, but will be much gentler and less prone to cause molten metal to be ejected from the apparatus. Moreover, the degree of stirring can be controlled by controlling the magnitude of the non-varying magnetic field. The magnitude of the non-varying magnetic field can be easily controlled by controlling the magnitude of the direct current supplied to coil 28 from DC source 30.

The present invention may be embodied in other specific forms without departing from the spirit or essential attributes thereof and, accordingly, reference should be made to the appended claims, rather than to the foregoing specifications, as indicating the scope of the invention.

I claim:

1. Apparatus for inductively melting a quantity of metal without a container, comprising:
   an induction coil having a plurality of turns defining a volume for receiving a quantity of metal, the induction coil being adapted to exert an electromagnetic force on the metal which increases toward the bottom portion of the metal;
   means for energizing the coil;
   a support means for supporting the metal from below and having an opening therethrough;
   cooling means for maintaining the support means at a preselected temperature;
   and means for applying a non-varying magnetic field to said quantity of metal.

2. Apparatus as in claim 1, wherein said means for applying the non-varying magnetic filed comprises a magnetically-permeable core means excited by a direct current, said core being n operative association with said quantity of metal.

3. Apparatus as in claim 1, further comprising a means for preventing levitation of the metal 4. Apparatus for inductively melting a quantity of metal without a container, comprising:
   a first induction coil having a plurality of turns disposed around said quantity of metal and energized by an alternating current, said first induction coil adapted to provide a greater electromagnetic force towards the lower portion of the quantity of metal within said induction coil, the topmost of said turns being wound in a direction opposite that of the others of said plurality of turns;
   a second induction coil operatively associated with a magnetically-permeable core and energized by a direct current, said core being disposed relative to said quantity of molten metal to apply a non-varying DC-derived magnetic field to said metal;
   support means having an opening therethrough, substantially in contact with the bottom surface of said quantity of metal; and
   cooling means for maintaining said support means at a preselected temperature.

5. A method of inductively melting a quantity of metal without a container, comprising the steps of:
   placing said quantity of metal within an induction coil;
   producing a time-varying electromagnetic field within said induction coil, said time-varying electro-magnetic field inducing eddy currents within said quantity of metal and electromagnetic forces against the surface of said quantity of metal, said electromagnetic force being stronger towards the lower portion of said quantity of metal, thereby causing said quantity of metal to melt from its top portion downwards;
   applying to said quantity of metal a non-varying DC-derived electromagnetic field in addition to said time-varying electromagnetic field;
   melting said quantity of metal so that heat transfer from the liquid part of said quantity of metal will melt all of the remaining solid part of said quantity of metal except for a rim of solid metal in contact with a support disposed at the bottom surface of said quantity of metal; and
   further melting said quantity of metal so that said liquid part of said quantity of metal will flow through an opening in said rim of solid metal and an opening in said support means.

* * * * *